United States Patent
Fulford et al.

(10) Patent No.: US 12,087,640 B2
(45) Date of Patent: Sep. 10, 2024

(54) HIGH DENSITY LOGIC FORMATION USING MULTI-DIMENSIONAL LASER ANNEALING

(71) Applicant: Tokyo Electron Limited, Tokyo (JP)

(72) Inventors: H. Jim Fulford, Albany, NY (US); Mark I. Gardner, Albany, NY (US); Jeffrey Smith, Albany, NY (US); Lars Liebmann, Albany, NY (US); Daniel Chanemougame, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 234 days.

(21) Appl. No.: 17/632,212

(22) PCT Filed: Jul. 29, 2020

(86) PCT No.: PCT/US2020/043986
§ 371 (c)(1),
(2) Date: Feb. 1, 2022

(87) PCT Pub. No.: WO2021/025914
PCT Pub. Date: Feb. 11, 2021

(65) Prior Publication Data
US 2022/0277957 A1    Sep. 1, 2022

Related U.S. Application Data

(60) Provisional application No. 62/883,192, filed on Aug. 6, 2019.

(51) Int. Cl.
*H01L 21/02* (2006.01)
*H01L 21/822* (2006.01)
(Continued)

(52) U.S. Cl.
CPC ............... *H01L 21/823807* (2013.01); *H01L 21/02293* (2013.01); *H01L 21/02532* (2013.01);
(Continued)

(58) Field of Classification Search
CPC ....... H01L 21/823807; H01L 21/02293; H01L 21/02532; H01L 21/02595;
(Continued)

(56) References Cited

U.S. PATENT DOCUMENTS 7,741,644 B2    6/2010    Lyu et al.
8,048,784 B2    11/2011   Kang et al.
(Continued)

FOREIGN PATENT DOCUMENTS

KR    10-0714401 B1    5/2007

OTHER PUBLICATIONS

International Search Report and Written Opinion of the International Searching Authority issued Nov. 13, 2020 in PCT/US2020/043986, 13 pages.

*Primary Examiner* — Farun Lu
*Assistant Examiner* — Sandra Milena Rodriguez Villan

(57) ABSTRACT

A method of forming transistor devices is described that includes forming a first transistor plane on a substrate, the first transistor plane including at least one layer of epitaxial film adaptable for forming channels of field effect transistors, depositing a first insulator layer on the first transistor plane, depositing a first layer of polycrystalline silicon on the first insulator layer, annealing the first layer of polycrystalline silicon using laser heating. The laser heating increases grain size of the first layer of polycrystalline silicon. The method further includes forming a second transistor plane on the first layer of polycrystalline silicon, the second transistor plane being adaptable for forming channels of field effect transistors, depositing a second insulator layer on the second transistor plane, depositing a second layer of polycrystalline silicon on the second insulator layer, and annealing the second layer of polycrystalline silicon using laser heating.

20 Claims, 7 Drawing Sheets

(51) Int. Cl.
   *H01L 21/8238* (2006.01)
   *H01L 27/092* (2006.01)
   *H01L 29/66* (2006.01)
   *H01L 29/786* (2006.01)

(52) U.S. Cl.
   CPC .. *H01L 21/02595* (2013.01); *H01L 21/02675* (2013.01); *H01L 21/8221* (2013.01); *H01L 27/0922* (2013.01); *H01L 29/6675* (2013.01); *H01L 29/78672* (2013.01)

(58) Field of Classification Search
   CPC ........... H01L 21/02675; H01L 21/8221; H01L 21/20; H01L 21/02667; H01L 27/0922; H01L 27/0688; H01L 29/6675; H01L 29/78672
   See application file for complete search history.

(56) References Cited

U.S. PATENT DOCUMENTS

| | | |
|---|---|---|
| 8,916,872 B1 | 12/2014 | Tran et al. |
| 9,087,689 B1 | 7/2015 | Tran et al. |
| 9,202,756 B1 | 12/2015 | Tran et al. |
| 9,613,805 B1 | 4/2017 | Schustereder et al. |
| 10,325,820 B1 | 6/2019 | Seo et al. |
| 10,804,165 B2 | 10/2020 | Seo et al. |
| 2007/0181953 A1 | 8/2007 | Lyu et al. |
| 2009/0104759 A1* | 4/2009 | Kang ................ H01L 21/02675 257/E21.09 |
| 2017/0104184 A1* | 4/2017 | Han ..................... H10K 71/166 |
| 2019/0214314 A1* | 7/2019 | Seo .................... H01L 29/78696 |
| 2019/0233321 A1* | 8/2019 | Ellison ................ B23K 26/009 |
| 2019/0295899 A1 | 9/2019 | Seo et al. |
| 2021/0277496 A1* | 9/2021 | Meng ................... B23K 26/034 |

* cited by examiner

HIGH DENSITY LOGIC FORMATION USING MULTI-DIMENSIONAL LASER ANNEALING

CROSS-REFERENCE TO RELATED APPLICATIONS

This application claims the benefit of priority to PCT international application no. PCT/US2020/043986 filed Jul. 29, 2020 and provisional application No. 62/883,192 filed Aug. 6, 2019, the entire contents of which are incorporated herein by reference.

BACKGROUND

Technical Field

The present disclosure is directed to microelectronic devices including semiconductor devices, transistors, and integrated circuits, including methods of microfabrication.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

This disclosure relates to microelectronic devices including semiconductor devices, transistors, and integrated circuits, including methods of microfabrication.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Subsequently, while traditional CMOS processes improves signal propagation speed, scaling from current manufacturing and chip-design technologies is becoming more difficult and costly. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

There is a need for 3D logic circuits for future high-density logic circuits for maximum use of silicon base area stacked vertically.

It is one object of the present disclosure to describe a method to form multiple planes of transistors. Other objectives include applying laser annealing to change polycrystalline silicon into single-crystal silicon. The heating amount and duration is targeted to the polysilicon layer so that the underlying layers are not heated above a predetermined temperature.

SUMMARY

In an exemplary embodiment, a method of forming transistor devices is described which includes forming a first transistor plane on a substrate, the first transistor plane including a plurality of field effect transistors, depositing a first insulator layer on the first transistor plane, depositing a first layer of polycrystalline silicon on the first insulator layer; and annealing the first layer of polycrystalline silicon using laser heating, the laser heating increasing grain size of the first layer of polycrystalline silicon.

In another exemplary embodiment, a method of forming transistor devices is described that includes forming a first transistor plane on a substrate, the first transistor plane including at least one layer of epitaxial film adaptable for forming channels of field effect transistors, depositing a first insulator layer on the first transistor plane, depositing a first layer of polycrystalline silicon on the first insulator layer, annealing the first layer of polycrystalline silicon using laser heating, the laser heating increasing grain size of the first layer of polycrystalline silicon, forming a second transistor plane on the first layer of polycrystalline silicon having the increased grain size, the second transistor plane being adaptable for forming channels of field effect transistors, depositing a second insulator layer on the second transistor plane, depositing a second layer of polycrystalline silicon on the second insulator layer, and annealing the second layer of polycrystalline silicon using laser heating, the laser heating increasing grain size of the second layer of polycrystalline silicon.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
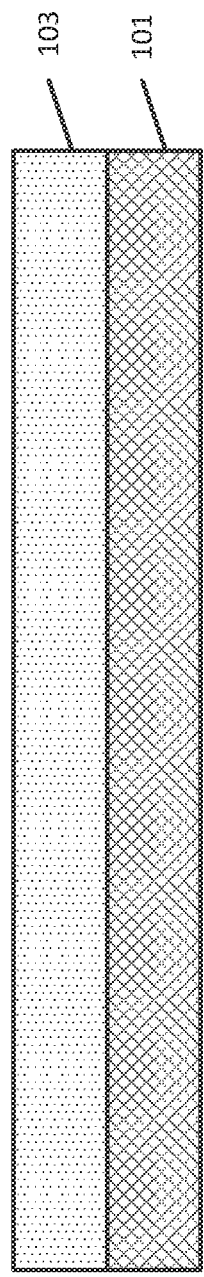
FIG. 1 is a cross-sectional schematic view of an example substrate segment herein.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure include a method to form multiple planes of transistors. This includes enabling greater than 20 3D nanoplanes of high quality silicon base substrates followed by enabling processing including laser treatment, cleans, CMP (chemical-mechanical polishing), and future epitaxial stacks as several optional embodiments. The multiple transistor planes herein are enabled by laser annealing to change polycrystalline silicon by increasing grain size, making the polycrystalline silicon function more like epitaxial silicon or monocrystalline silicon. This enables growing additional epitaxial layers for more transistor planes including gate-all-around transistor devices. Each transistor plane can contain a film stack for making CFET (nmos over pmos) nanoplane layers. Each additional layer is started by capping with an oxide or other insulator, depositing polycrystalline silicon, using a laser anneal to convert to epitaxial-like silicon, followed by formation of a given transistor plane, which could be logic and/or memory. For purposes of this disclosure, epitaxial-like silicon means a silicon crystal layer on which epitaxial crystal growth can be performed. Epitaxial-like silicon may be any crystalline silicon that can function as epitaxial silicon, including single crystal silicon, which is also referred to as monocrystalline silicon.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integrated circuits address the scaling challenge by stacking 2D dies and connecting them in the 3rd dimension. A common form of 3D integrated circuit design has been wafer bonding. Wafer bonding is a method where several thin-film devices are bonded cumulatively, which allows a large number of device layers. The method involves fabrication of separate devices in separate wafers, reduction in the thickness of the wafers, providing front and back leads, and connecting the thinned die to each other. The method has been used to fabricate 3D integrated circuits with more than three active layers. 3D integrated circuits are currently used for NAND flash memory in mobile devices. However, the demand for smaller packages and the move to multi-dimensional planes of logic as well as memory requires alternative approaches to fabrication.

As one alternative to wafer bonding, monolithic 3D integrated circuits are built in layers on a single semiconductor wafer. With monolithic 3D integrated circuits, there is no need for aligning, thinning, bonding, or through silicon Vias. However, creation of multiple thin layers of defect free silicon requires utilizing low temperature bonding and placing layers on top of active transistor circuitry.

In order to make multi-dimensional planes of logic and memory, a first transistor plane is formed on a substrate. In practice, monocrystalline silicon is produced from a seed crystal, then resulting monocrystalline ingots are sliced into wafers and polished, which is an expensive, time consuming process. The transistor plane is formed through microfabrication processes. It is preferable that this transistor plane be for any type of transistor or logic or memory. After forming the first transistor plane, polycrystalline silicon is deposited on this first transistor plane. However, polysilicon is not desirable as a material for integrated circuits. A single crystal is critical for electronics, since grain boundaries, impurities, and crystallographic defects can significantly impact the local electronic properties of the material, which in turn affects the functionality, performance, and reliability of the logic devices by interfering with their proper operation.

In 2D semiconductor fabrication, the single crystal substrate is used for epitaxial growth and formation of transistor channels. In particular, semiconductor films are grown epitaxially on semiconductor substrate wafers. For the case of epitaxial growth of a planar film atop a substrate wafer, the epitaxial film's lattice will have a specific orientation relative to the substrate wafer's crystalline lattice such as the [001] Miller index of the film aligning with the [001] index of the substrate.

In order to continue this fabrication process for additional transistor layers, it is necessary to control crystal orientation above a transistor layer. As a solution, a laser annealing process has been developed that enables conversion of polycrystalline silicon into single crystal silicon without impacting the transistor layers below the polycrystalline silicon. In some embodiments, multiple transistor planes disclosed herein are enabled by laser annealing to convert polycrystalline silicon by increasing grain size, making the polycrystalline silicon function more like epitaxial silicon or monocrystalline silicon. This enables growing additional epitaxial layers for more transistor planes including gate-all-around transistor devices.

In one embodiment, a first transistor plane is formed on a substrate in a conventional 2D fabrication process. This transistor plane can be for any type of transistor or logic or memory. After forming the first transistor plane, polycrystalline silicon is deposited on the first transistor plane. The polycrystalline silicon is converted, using a laser anneal process on upper base substrate planes, to be epitaxial-like silicon. Then a subsequent transistor plane can be formed, capped with polycrystalline silicon and converted to epitaxial-like silicon. This process may be repeated for any number of transistor planes.

In an exemplary embodiment, one CFET fabrication process uses a silicon substrate and epitaxial grows alternating layers of SiGe and Si up to 8 to 12 total layers. Limiting the height and/or number of layers in the epitaxial stack can be beneficial for better quality films. Then the SiGe is removed in the stack sandwich such that 4 to 6 layers of transistor planes are available to make logic as gate-all-around (GAA) field effect transistors. Two nanoplanes of transistors can be tied together to make an NMOS or PMOS device. Thus, this fabrication process only allows for a total of three actual transistor planes. In other words, a vertical stack of three FETs is possible while keeping within quality specifications. Three levels of transistors, however, are insufficient to fully enable 3D logic formation for cost effective solutions. For volume scaling, more and more layers of transistors will be required.

Techniques disclosed herein enable 3D planes of transistors to be at least greater than twenty planes or levels of high quality FETs. Each plane of transistors can be used to form any type of transistor including, but not limited to, CFET, planar, FinFET, and memory. Techniques herein can then be expanded as volume scaling increases.

One embodiment will now be described with reference to the figures. FIG. 1 is a cross-sectional schematic view of an exemplary substrate segment herein. A silicon substrate or SOI (silicon-on-insulator) substrate 101 is received. A first transistor plane (circuit plane) 103 is fabricated on the substrate 101. This first plane can include fully-formed field effect transistors through metal layer 1 routing or this transistor plane can include the layer(s) to form channels of transistor devices subsequently. The transistor plane can be CFET devices, FinFet, Memory, Logic or any devices. Optionally, CFET planes are formed prior to etching an entire stack of a given transistor plane or of multiple, separated transistor planes. Accordingly, in a preferred embodiment, there is no restriction on epitaxial stack growth temperature. Each plane of silicon can be used for any type of transistor or memory element without restriction. In one example, forming this first transistor plane can include growing 8 to 12 layer of alternating SiGe/Si using an epitaxial growth process with substantially no temperature limitations.

Figure 2:
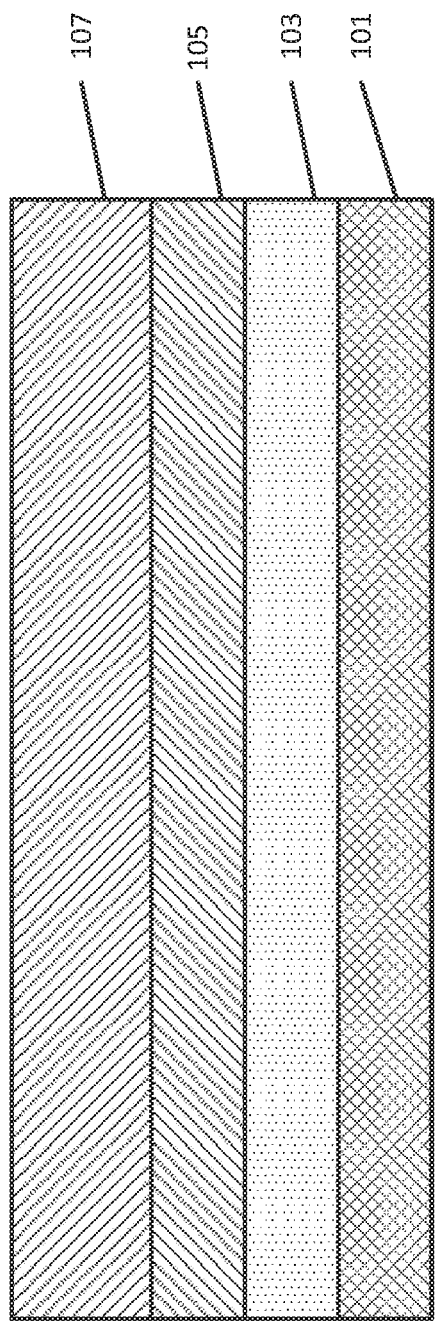
FIG. 2 illustrates a layer of silicon dioxide is deposited on the first transistor plane.

After forming the first transistor plane 103, an insulator is deposited on the first transistor plane. FIG. 2 illustrates a layer of silicon dioxide 105 is deposited on the first transistor plane 103. Other types of oxides or dielectric films can be selected. For most applications, an insulator is deposited to a preferred thickness of 500 to 3000 Angstroms. Next, polycrystalline silicon (also referred to as polysilicon) is deposited. Deposition temperature is preferably below 580° C. Polysilicon 107 can be deposited using LPCVD (low-pressure chemical vapor deposition), PECVD (plasma-enhanced chemical vapor deposition), sputter deposition, or any polysilicon deposition method (even at room temperature).

Figure 3:
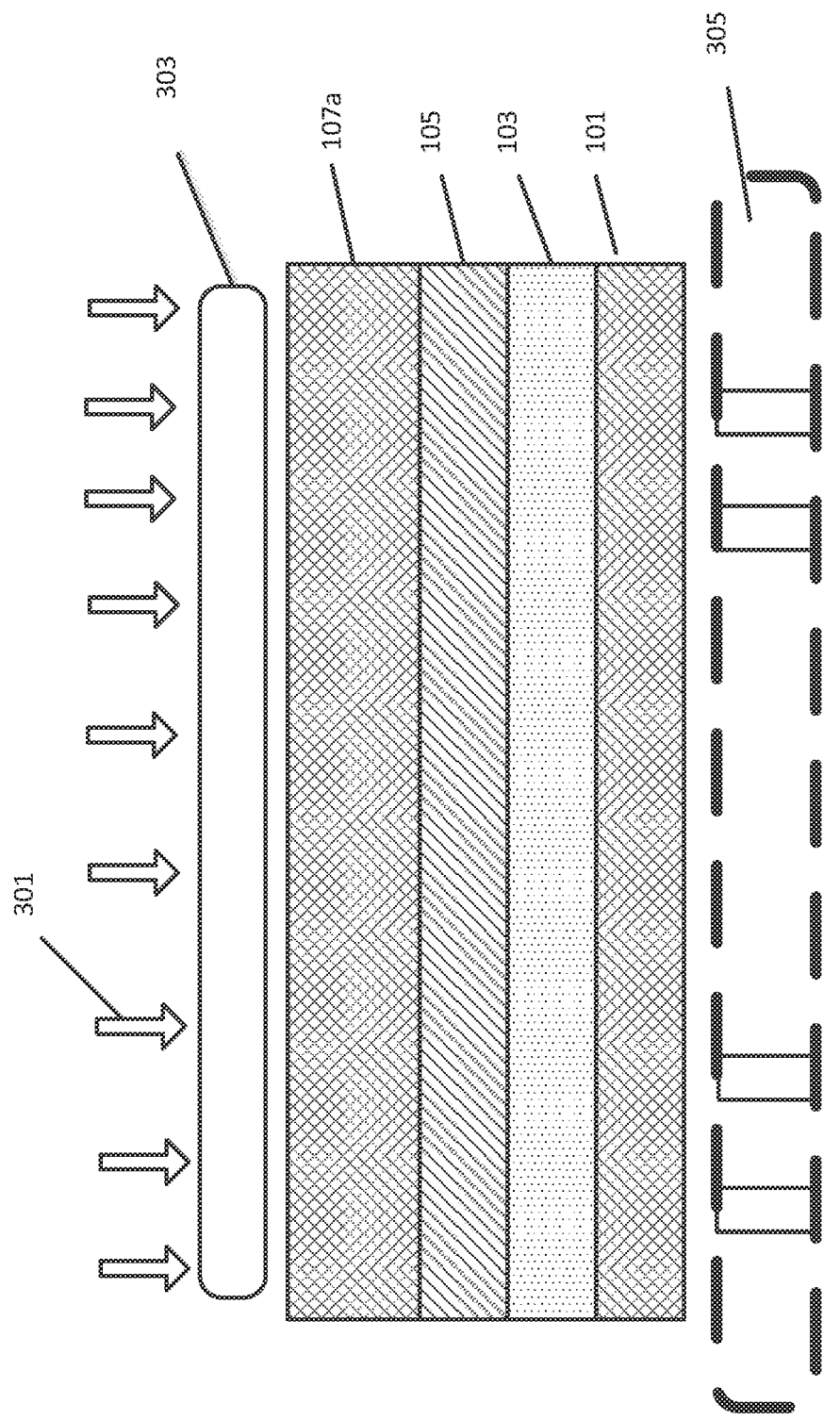
FIG. 3 illustrates a laser anneal exposure converting the polysilicon to an epitaxial-like silicon after the laser anneal.

At this point, a first transistor plane 103 has been formed and insulated, and polysilicon 107 is now on the working surface of the substrate. Polysilicon, however, is not satisfactory as a material for epitaxial growth and transistor channel materials. Monocrystalline silicon is satisfactory for epitaxial growth. With techniques disclosed herein, a scanning laser crystallization treatment is executed. This laser annealing process increases grain size of the polysilicon so that the resulting layer has sufficiently large grain boundaries that the resulting layer functions essentially like a layer of monocrystalline silicon to support epitaxial growth of additional silicon layers. FIG. 3 illustrates a laser anneal exposure that converts the polysilicon to an epitaxial-like silicon after the laser anneal.

For the scanning laser crystallization treatment, any type of laser can be selected for use. Example wavelengths for silicon treatment are typically 100 nm to 800 nm. Either the wafer can be held stationary and laser scanned across the wafer, or the laser can be fixed in position while the substrate (wafer) is rotated or moved through the laser. Such scanning motion allows for any type of laser system to be used. As can be appreciated, an amount of energy delivered, scanning rate, and laser system will depend on a given stack/area to be recrystallized.

By way of a non-limiting specific example, a laser wavelength (1) and process conditions that rapidly heats silicon or polysilicon is a wavelength of 532 nm, pulse width of 10-15 ns, scanning speed of 14 to 45 cm/s, power 1 W to 7 W, and beam size of 2 to 3 mm by 40-80 um. Scanning time and duration can be adjusted according to a thickness of a given polysilicon film or area to be scanned. The laser is scanning is performed such that just the polysilicon region will receive the energy (heating effect). The laser scanning is performed such that the layers, materials, and devices below the oxide insulator can remain less than 400 C. In other words, the heating amount and duration is targeted to the polysilicon layer so that the underlying layers are not heated above a predetermined temperature.

The laser beam 301 melts the polysilicon 107a, which then recrystallizes to a substantially larger grain size. In one embodiment, the grain size increases are 4 to 10 times larger after laser treatment (with typical single crystal grains). Note that with advanced 3D CFET channels being on the order of 5 nm, the laser annealing technique herein has essentially achieved single crystal film properties by reforming grain size to be greater than 100 nanometers. As such, the majority of channels formed with recrystallized polysilicon will not have a single grain boundary. Additionally, with the laser beam 301 being a coherent light source, there is no dispersion or significant spreading of the laser beam or loss of energy. Accordingly for channel scales on the order of single or double digit nanometers, the layer of polysilicon 107a has grain size increased sufficiently to function as single crystal silicon for given channels.

For laser annealing, air can be used as a medium 303 between the laser beam 301 and the polysilicon layer 107a to be annealed. Using air as the medium 303 is convenient for wafer handling considerations. Note, however, that other mediums can be used. For example, the substrate can use an immersion in water or oil or other fluids because with a coherent laser light source many different mediums are available. In some embodiments, water or chilled water can be used. Using chilled water can be beneficial for substrate cooling because water has a relative high specific heat capacity. The use of other mediums (such as chilled water) can act as a cooling effect for the wafer substrate below the polysilicon. According, such chilling provides two benefits. A chilled medium enables protection of underlying transistor planes, and also serves to further augment grain size increases by enabling higher annealing temperatures.

Another embodiment herein uses cryogenic wafer chuck 305 to obtain a maximum temperature gradient between the laser beam on the polysilicon layer being annealed and the silicon substrate. A wafer chuck is a device for holding the wafer. Wafer chucks are typically round and slightly larger than the wafer size. However, their shape and size may vary depending on the shape and size of the wafer. A wafer chuck may hold a wafer in place by applying a vacuum to the backside of the wafer. Other embodiments use a variable temperature that spans temperatures from 400K (127 C) down to 30K (−243K) for a laser anneal system. Example coolants for the laser system can include both liquid nitrogen and liquid helium with two cooling centerpoints (depending on the desired temperature window) thereby enabling effective wafer cycling. Laser scanning can be limited to a particular region of a substrate, or an entire wafer surface.

Figure 4:
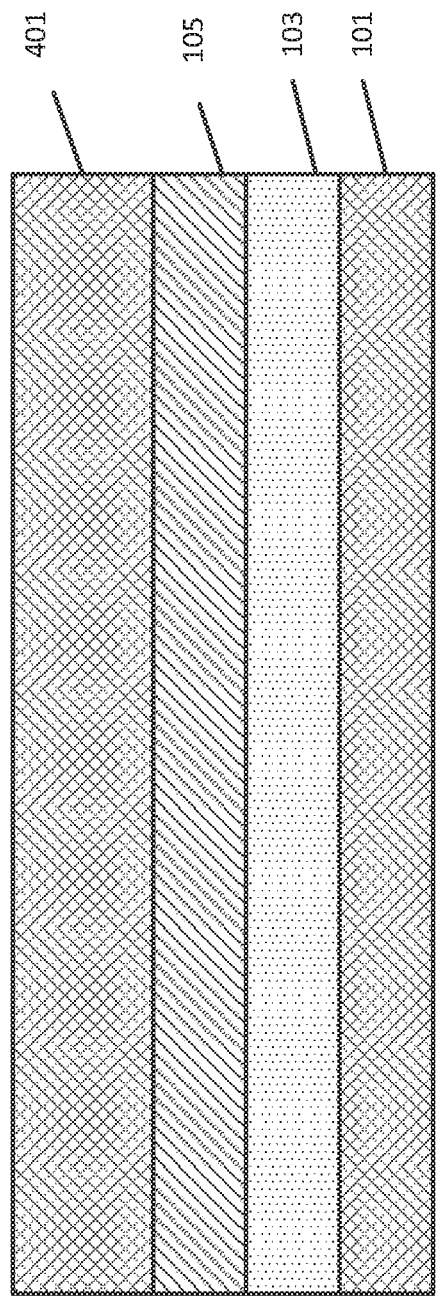
FIG. 4 illustrates an example result after polishing the layer of epitaxial-like silicon.

Following laser treatment, a polishing and/or planarization step can optionally be executed. FIG. 4 illustrates an example result after polishing the layer of epitaxial-like silicon. For example, a CMP (chemical-mechanical polishing) step can be executed as one planarization option. A CMP step can modify polysilicon channel regions to modify a now large-grained, relatively thick layer to achieve a relatively thin epitaxial-like silicon channel 401. Planarization/polishing are beneficial because surface roughness after laser anneal can be higher. This roughness can be reduced by an order of magnitude following CMP and cleaning steps, thereby thinning the layer of anneal polysilicon. Example cleaning treatments can include (1) immersing the CMP polished poly-Si film into two mixture solutions (NH4OH:H2O2:H2O=1:4:20 and HCl:H2O2:H2O=1:1:6) at 75° C. for 10 minutes to remove most of the residuals from CMP; (2) immersing the substrate into pure H2O2 for 10 minutes to form sacrificial oxide on the poly-Si surface, and (3) removing the sacrificial oxide using dilute HF solution (HF:H2O=1:10) for 5 minutes.

Figure 5:
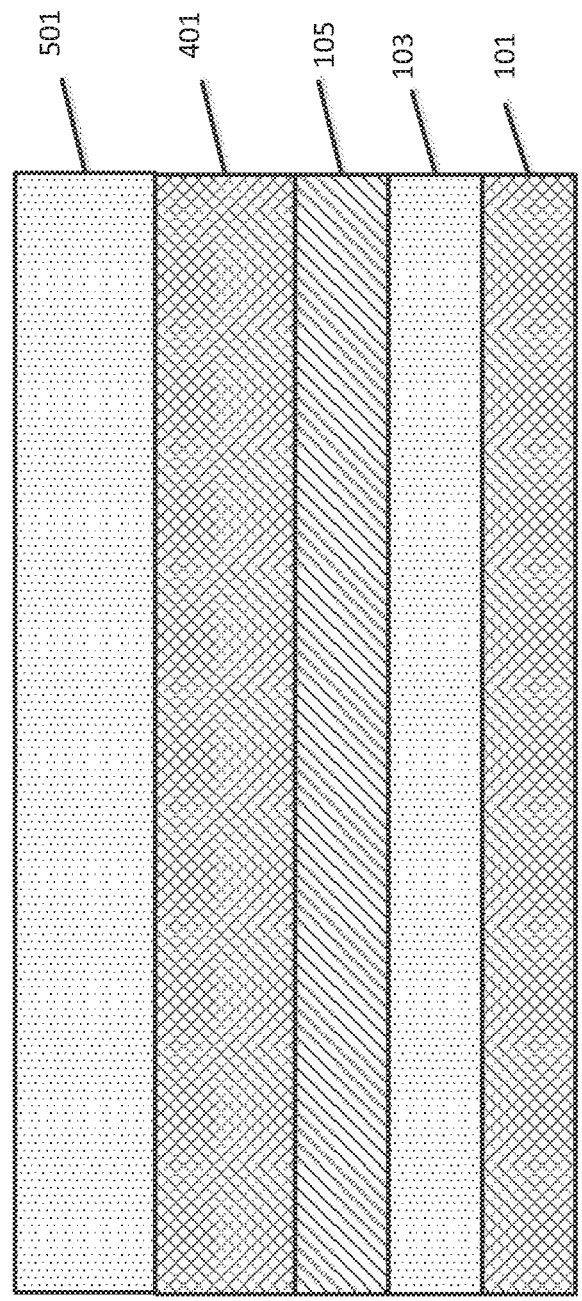
FIG. 5 illustrates a second transistor plane formed on the anneal and polished layer of crystalline silicon.

With a first transistor plane 103 formed and insulator 105, and with a polysilicon layer converted to large grain epitaxial-like crystal silicon 401, any number of additional transistor planes can be formed. FIG. 5 shows a second transistor plane 501 formed on the annealed and polished layer of crystalline silicon. Any type of transistors can be formed. For example, a second plane of CFET can be formed. Each transistor plane herein can itself have a stack of transistors. Accordingly, in one example a second set 8 to 12 layers of alternating SiGe/Si can be grown on the substrate. This growth can be executed with current epitaxial growth processes at temperatures as low as about 300 to 400° C. Note that these are the second 12 layers on the substrate, thus a total of 24 nanoplanes exist (12 silicon nanoplanes total, and 12 SiGe nanoplanes total). Thus each transistor plane can have multiple FETs. For example, the first transistor plane 103 can be fabricated to have a vertical stack of four FETs. The second transistor plane 501 can also have a vertical stack of four FETs (or two or six . . . ). Thus, by forming two transistor planes, the substrate can have a total vertical stack of 12 FETs, thereby dramatically increasing transistor count per area (by increasing volume of transistors).

Figure 6:
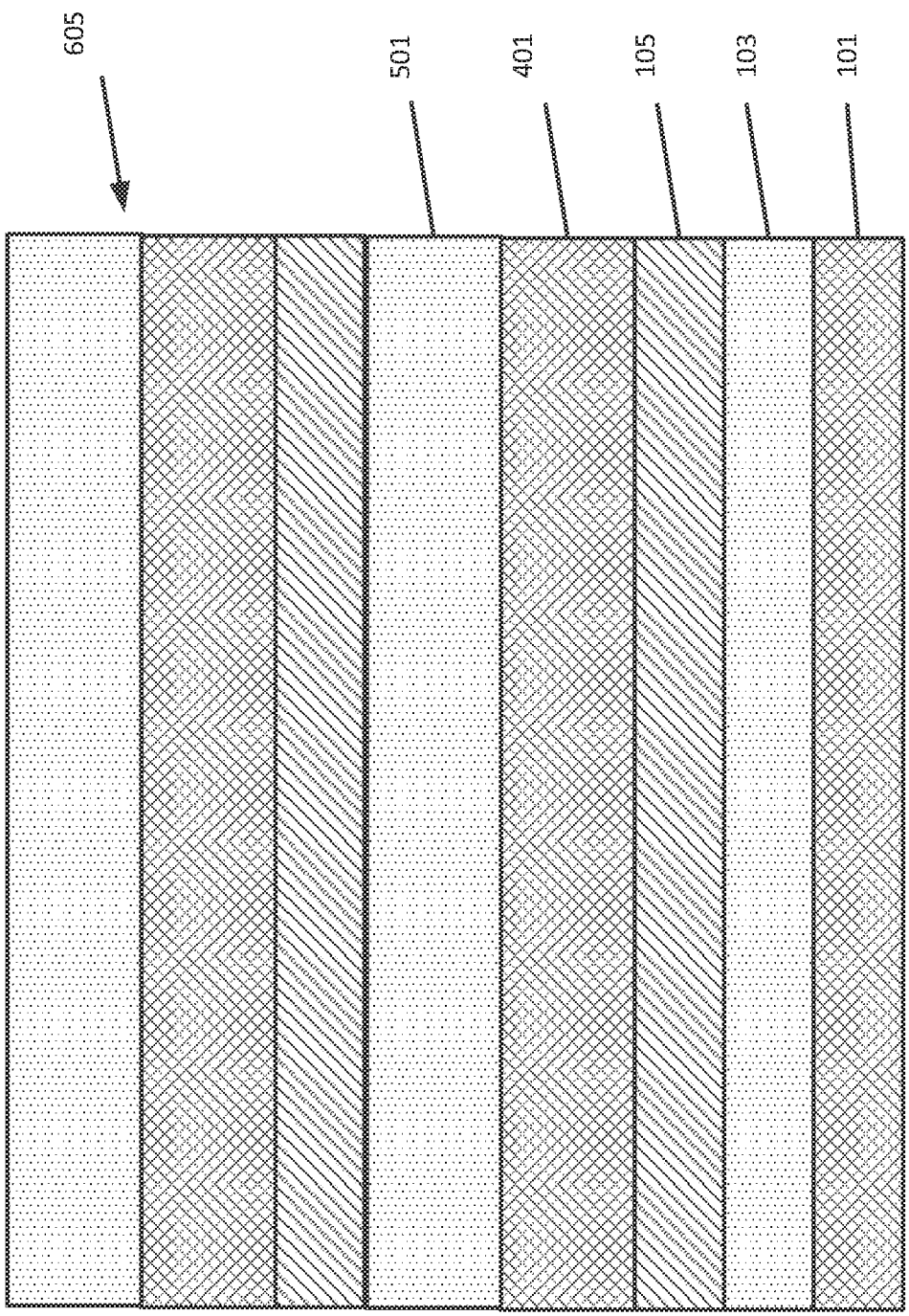
FIG. 6 illustrates how techniques herein can be repeated for any number of transistor planes.

FIG. 6 illustrates how techniques herein can be repeated for any number of transistor planes. Each transistor plane can have a single transistor or a stack of transistors or channels. With multiple transistors per transistor plane, each additional transistor plane (N+1) 605 can greatly increase a total number of planes or levels of transistors on the substrate.

Figure 7:
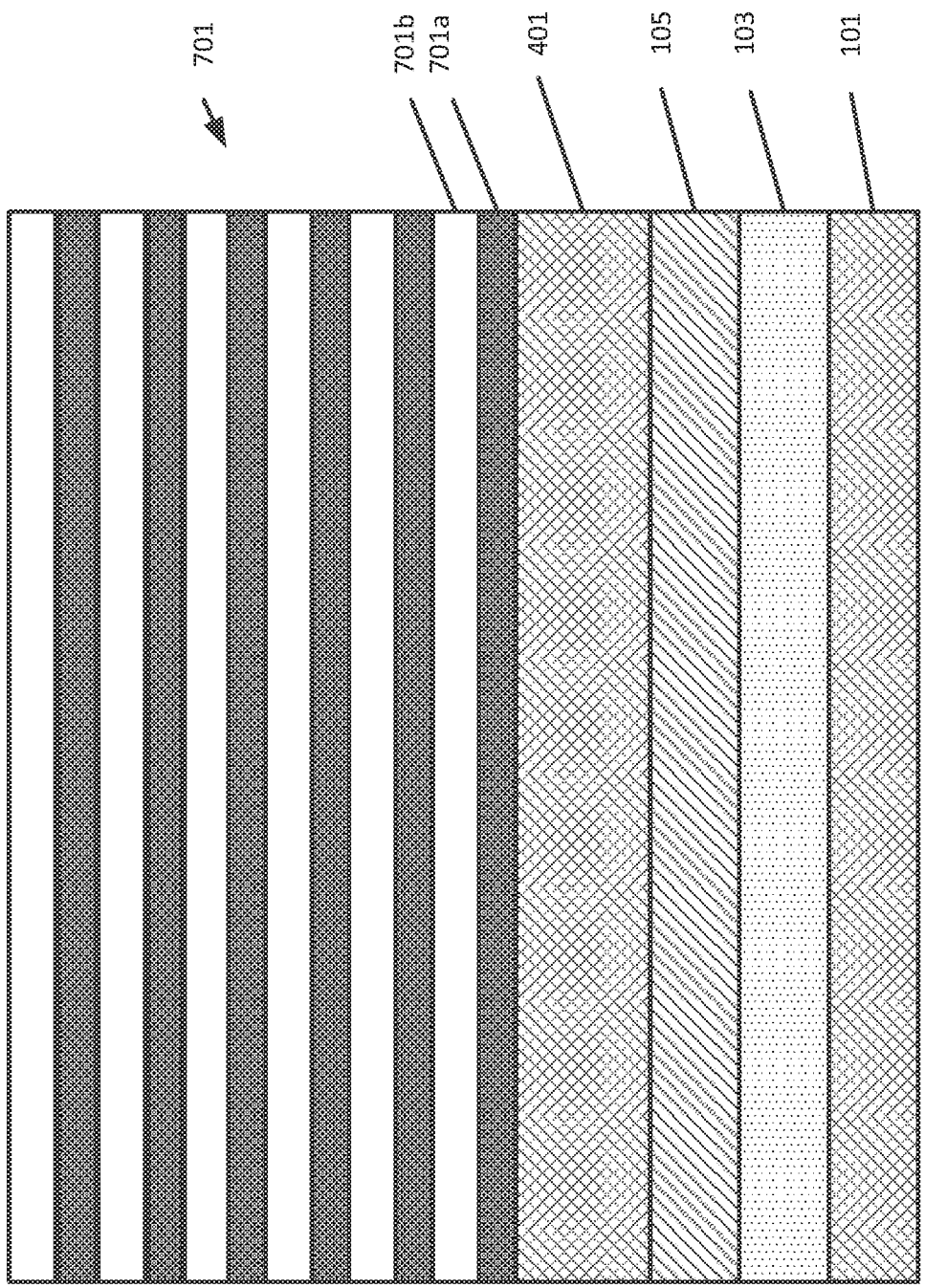
FIG. 7 illustrates that with polysilicon converted to epitaxial-like silicon, what is supported is growing a new stack of silicon layers.

FIG. 7 illustrates that with polysilicon converted to epitaxial-like silicon 401, what is supported is growing a new stack of silicon layers. For example, epitaxial growth can be executed to form alternating layers of silicon 701*b* and silicon germanium 701*a*, being grown from the epitaxial-like silicon 401. After growing this stack of silicon layers, the entire nanoplane stack 701 can be etched to form channels and future source/drain regions. In an example embodiment, the Nano plane stack is grown in one flow with alternating layers of SiGe/Si/SiGe/Si and etched. The channel region is cut in the y direction to form the future source/drain regions. Then the SiGe layers are removed leaving planes of Si. Since adjacent regions of Silicon are open, a 360 degree dielectric (referred to as GAA—gate all around) is formed on each channel region followed by a metal gate electrode designed for NMOS and PMOS devices. Then the source/drain region is at the end side of the channel.

Thus, techniques herein enable multiple transistor planes, which increase density in 3D CFET and other advanced logic applications. Techniques herein can be integrated with CFET flows, finFET flows, memory flows, and other flows. With the option to hold a substrate stationary during laser anneal, or to move the substrate through a wafer beam, many types of laser systems can be used for annealing herein. Techniques provide enhanced performance and reliability for microfabrication. Better silicon formation comes from better silicon properties for improved mobility, Idsat, Idoff, Vtc control, and other beneficial properties. Any type of logic, transistor type (including, for example, CFET, PLANER, Finfet) may be fabricated on each new plane of epitaxial-like silicon created by laser anneal. Processes herein can continue to stack vertically to achieve needed 3D Density for N+1 transistor/logic/memory planes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method comprising:
depositing an insulator layer over a substrate;
depositing a polycrystalline semiconductor layer on the insulator layer, the polycrystalline semiconductor layer having a first grain size, the insulator layer separating the polycrystalline semiconductor layer from any underlying semiconductor materials;

annealing the polycrystalline semiconductor layer using a laser to increase a grain size of the polycrystalline semiconductor layer from the first grain size to a second grain size larger than the first grain size and thereby converting the polycrystalline semiconductor layer to a recrystallized semiconductor layer; and epitaxially growing a semiconductor layer on the recrystallized silicon layer.

2. The method of claim 1, wherein one or more electronic devices are formed on or in the substrate under the insulator layer.

3. The method of claim 2, wherein the insulator layer substantially prevents the annealing from affecting the one or more electronic devices or the substrate.

4. The method of claim 2, wherein the recrystallized semiconductor layer, the epitaxially grown semiconductor layer, or both the recrystallized semiconductor layer and the epitaxially grown semiconductor layer are utilized as part of a semiconductor device.

5. The method of claim 2, further comprising planarizing the recrystallized semiconductor layer.

6. The method of claim 2, where the one or more electronic devices includes multiple levels of transistors in which one transistor is positioned directly above a second transistor relative to the substrate.

7. The method of claim 1, wherein annealing the polycrystalline semiconductor layer includes increasing a grain size sufficient to convert the polycrystalline semiconductor layer to a monocrystalline semiconductor film.

8. The method of claim 3, wherein the annealing the polycrystalline semiconductor layer is performed such that the heating amount and duration is targeted to the polycrystalline semiconductor layer and the one or more electronic devices and substrate are not heated above a predetermined temperature.

9. The method of claim 1, wherein annealing the polycrystalline semiconductor layer includes laser heating with chilled water as a medium between the laser beam and the polycrystalline semiconductor layer.

10. The method of claim 1, wherein the substrate is held by a wafer chuck, and wherein the annealing the polycrystalline semiconductor layer using laser heating includes laser heating while the polycrystalline semiconductor layer is in a cryogenic coolant.

11. The method of claim 10, wherein the cryogenic coolant is at a temperature in a range of 400K to 30K.

12. A method comprising:

providing a first semiconductor layer; depositing an insulator layer over the first semiconductor layer;

depositing a second semiconductor layer by a non-epitaxial process over the insulator layer, the second semiconductor layer comprising a polycrystalline layer with grains having a first grain size, the insulator layer separating the second semiconductor layer from any underlying semiconductor materials; and annealing the second semiconductor layer to have a crystal orientation that is independent from the first semiconductor layer and a second grain size that is bigger than the first grain size.

13. The method of claim 12, further comprising epitaxially growing one or more layers on the second semiconductor layer after annealing the second semiconductor layer.

14. He method of claim 13, wherein the second semiconductor layer and one or more layers epitaxially grown on the second semiconductor layer are further processed to create multiple levels of transistors in which at least one field-effect transistor is positioned directly above a second field effect transistor.

15. The method of claim 12, wherein the second semiconductor layer is annealed using a laser.

16. The method of claim 15, wherein the laser is applied such that the heating amount and duration is targeted to the second semiconductor layer and such that the first semiconductor layer is not heated above a predetermined temperature.

17. The method of claim 12, further comprising: growing alternating SiGe and Si layers on the second semiconductor layer via an epitaxial process.

18. The method of claim 12, wherein the annealing the second semiconductor layer includes laser beam heating with chilled water as a medium between the laser beam and the second semiconductor layer.

19. The method of claim 12, wherein the first semiconductor layer is provided on or within a substrate that is held by a cryogenic wafer chuck.

20. The method of claim 15, wherein the laser melts and recrystallizes the second semiconductor layer.

* * * * *